United States Patent
Heinz et al.

(10) Patent No.: US 7,595,579 B2
(45) Date of Patent: Sep. 29, 2009

(54) PIEZOELECTRIC ACTUATOR MODULE WITH A SHEATHED PIEZOELECTRIC ACTUATOR

(75) Inventors: Rudolf Heinz, Renningen (DE); Dieter Kienzler, Leonberg (DE); Roland Herwig, Besigheim (DE); Udo Schaich, Stuttgart (DE)

(73) Assignee: Robert Bosch GmbH, Stuttgart (DE)

( * ) Notice: Subject to any disclaimer, the term of this patent is extended or adjusted under 35 U.S.C. 154(b) by 82 days.

(21) Appl. No.: 11/848,822

(22) Filed: Aug. 31, 2007

(65) Prior Publication Data

US 2008/0141981 A1    Jun. 19, 2008

(30) Foreign Application Priority Data

Sep. 14, 2006 (DE) .............. 10 2006 043 073
Apr. 13, 2007 (DE) .............. 10 2007 018 039

(51) Int. Cl.
H00L 41/08    (2006.01)

(52) U.S. Cl. .................. 310/323.01; 310/328; 310/340

(58) Field of Classification Search ............ 310/325, 310/328, 340
See application file for complete search history.

(56) References Cited

U.S. PATENT DOCUMENTS

| | | | |
|---|---|---|---|
| 4,051,396 A * | 9/1977 | Berlincourt ........... 310/339 |
| 4,958,101 A * | 9/1990 | Takahashi et al. ..... 310/328 |
| 5,113,108 A * | 5/1992 | Yamashita et al. ..... 310/328 |
| 5,148,077 A * | 9/1992 | Grawey et al. ........ 310/328 |
| 5,239,223 A * | 8/1993 | Miyoshi .............. 310/328 |
| 5,389,851 A * | 2/1995 | Kimura et al. ........ 310/340 |
| 6,552,472 B1 * | 4/2003 | Heinz ................ 310/328 |
| 6,700,308 B2 * | 3/2004 | Heinz ................ 310/328 |
| 7,358,646 B2 * | 4/2008 | Asano et al. ......... 310/328 |

FOREIGN PATENT DOCUMENTS

DE    10 2005 024 710 A1 *    5/2005

* cited by examiner

*Primary Examiner*—Mark Budd
(74) *Attorney, Agent, or Firm*—Ronald E. Greigg

(57) ABSTRACT

A piezoelectric actuator module having a piezoelectric actuator, fastened between an actuator head and an actuator foot, and having a sheath, surrounding the piezoelectric actuator, for electrical passivation, is proposed in which the sheath is an insulation guard layer that is joined by nonpositive and/or positive engagement, by means of a mechanical attachment, to attachment components in the region of the end faces of the piezoelectric actuator or of the actuator head and/or of the actuator foot.

15 Claims, 4 Drawing Sheets

PIEZOELECTRIC ACTUATOR MODULE WITH A SHEATHED PIEZOELECTRIC ACTUATOR

REFERENCE TO FOREIGN PATENT APPLICATION

This application is based on German Patent Application Nos. 10 2006 043 073.5 filed 14 Sep. 2006 and 10 2007 018 039.1 filed 13 Apr. 2007, upon which priority is claimed.

BACKGROUND OF THE INVENTION

1. Field Of The Invention

The invention relates to an improved piezoelectric actuator module and more particularly to such an actuator bathed by liquid media, having a sheathed piezoelectric actuator that can be used in a piezoelectric injector for metering fuel in a chronologically and quantitatively precise manner in an internal combustion engine.

2. Description of the Prior Art

One known piezoelectric injector essentially comprises a holder body and the piezoelectric actuator module, which is disposed in the holder body and has the piezoelectric actuator, located between a head and foot part and attachment components, that comprises a plurality of piezoelectric elements stacked one above the other.

It is known per se that to construct the aforementioned piezoelectric actuator, piezoelectric elements can be used in such a way that by utilizing what is known as the piezoelectric effect, control of the needle stroke of a valve or the like can be accomplished. Piezoelectric layers of the piezoelectric elements are constructed from a material having the suitable crystalline structure, such that when an external electrical voltage is applied, a mechanical reaction of the piezoelectric element ensues, which depending on the crystalline structure and on the regions contacted by the electrical voltage, represents a compression or tension in a predeterminable direction. Such piezoelectric actuators are suitable for instance for applications in which reciprocating motions take place under conditions involving strong actuation forces and high cycle frequencies.

For example, one such piezoelectric actuator, as a component of a piezoelectric injector in so-called common rail injection systems (CR injector), is known from German Patent Disclosure DE 10026005 A1. In this piezoelectric actuator as well, piezoelectric elements are arranged in a stack that is held between two stops in prestressed fashion via an actuator foot and an actuator head. Each piezoelectric layer is also fastened here between two internal electrodes, by way of which an electrical voltage can be applied from outside. Because of this electrical voltage, the piezoelectric elements then each execute short reciprocating motions in the direction of the potential drop, and these motions add up to make the total stroke of the piezoelectric actuator. This total stroke is variable by way of the magnitude of the voltage applied and can be transmitted to a mechanical final control element.

In these know CR injectors, a nozzle needle controlled indirectly by the piezoelectric actuator module is present as a fuel valve, and the piezoelectric actuator, by way of a sleeve and diaphragm arrangement as the sheath that compensates for stroke and temperature-related expansion is surrounded directly or indirectly by the pressure of the fuel, which in such low-pressure systems is approximately 60 bar, thus making it possible to achieve the opening and closing functions. To attain optimal deflection while requiring minimal space, the internal electrodes of the piezoelectric actuator must encompass the entire cross section of the piezoelectric actuator, except for the inactive contacting zone. This means that the internal electrodes of alternating polarity are exposed at the side faces of the ceramic layers.

This known concept cannot readily be adopted in CR injectors with direct control of the nozzle needle, however, since in that case the piezoelectric actuator module is operated in the high-pressure region of the fuel, and a rigid sleeve and diaphragm arrangement as the sheath, under the conditions of what space is available in the piezoelectric injector, would not withstand the high system pressures and relatively long reciprocating motions of the piezoelectric actuator.

For this reason, an electrical passivation of these side faces of the piezoelectric actuator and of the attached contact components for the electrical passivation of the entire piezoelectric actuator is necessary, to prevent the media bathing the piezoelectric actuator from getting underneath it and to avoid the attendant possible electrical sparkovers or short circuits between adjacent internal electrodes. Such effects can result for instance from moisture or from the fuels and lubricants themselves, such as diesel, rapeseed methylester, water, or the like, in the operation of the piezoelectric actuator.

To achieve an electrical and mechanical insulation of the piezoelectric actuator, a flexible sheath of the piezoelectric actuator is often proposed. From German Patent Disclosure DE 10230032 A1, to avoid the aforementioned disadvantages, an arrangement with a piezoelectric actuator module bathed in fluid media is known in which the piezoelectric elements are cast in a variable-shape insulation compound, which in turn is placed in a housing jacket that is closed off laterally and at the top and bottom ends from the medium.

However, fuel can migrate under the two ends of this housing jacket, in the region where they contact the steel attachment components of the head part and foot part of the piezoelectric actuator module, and thus the known arrangements do not offer reliable sealing protection, and hence the proper function of the piezoelectric actuator over its service life is threatened.

SUMMARY AND ADVANTAGES OF THE INVENTION

The invention is based on a piezoelectric actuator module, described at the outset, with piezoelectric elements that are fastened between a head and a foot part, in which a sleeve surrounding at least the piezoelectric elements is present as a component of a sheath. According to the invention, the sleeve is a plastic sleeve, preferably in the form of a so-called shrink-fit tubing, which is made on the circumference of the cylindrical head and/or foot part, which as a rule comprises steel, of the piezoelectric actuator module, resting solidly and tightly in annularly or helically extending indentations.

In a first embodiment of the piezoelectric actuator module of the invention, in the case of helically extending indentations, a spiral spring is attached to the circumference of the plastic sleeve that rests on the head and/or foot part, and this spring, corresponding to the helically extending indentations, such as trapezoidally threaded grooves, presses the plastic sleeve into these indentations.

In a second embodiment of the piezoelectric actuator module of the invention, in the case of at least one annularly extending indentation, a ring with spring lugs on its circumference is attached to the circumference of the plastic sleeve resting on the head and/or foot part, and this ring, corresponding to the at least one annularly extending indentation, presses the plastic sleeve into these indentations.

Moreover, it is advantageously provided that the plastic sleeve rests on the piezoelectric actuator module via an electrical insulation layer, at least in the region of the piezoelectric elements.

In a preferred application of the invention, the piezoelectric actuator module is a component of a piezoelectric injector with direct needle control for an injection system for fuel in an internal combustion engine, in which the fuel at high pressure bathes the plastic sleeve.

The attachment, proposed according to the invention, of the plastic sleeve to the head and foot part of the piezoelectric actuator module makes an additional radial pressure possible against the ends of the plastic sleeve or of the shrink-fit tubing as well as compartmentalization of the shrink-fit tubing over these parts.

This arrangement thus maximally assures enhanced tightness of tie piezoelectric actuator module with respect to the surrounding fuel for its entire service life, especially under conditions of changing temperatures. When the shrink-fit tubing, as a plastic sleeve, is shrunk on, these helical indentations are filled almost completely by the shrink-fit tubing, as a result of which the compartmentalization of the shrink-fit tubing is attained, and flowing of the shrink-fit tubing is also prevented.

This special shaping of the indentation also assures secure sealing under conditions of variable thermal expansion between the head and/or foot part of steel and the shrink-fit tubing as a plastic sleeve. The radial clamping force, generated by the resilient clamping element in the form of an external applied spiral spring or spring lugs, is virtually constant, and an additional elevated pressure of the shrink-fit tubing against the threaded flanks, for instance, of the indentations is thus always present and tightness is achieved.

The invention relates to a piezoelectric actuator module, having a piezoelectric actuator fastened between an actuator head and an actuator foot, and having a sheath, surrounding the piezoelectric actuator, for electrical passivation. According to the invention, advantageously, the sheath is an insulation guard layer, which is joined by nonpositive and/or positive engagement by means of a mechanical attachment.

The invention thus in a simple and economical way, by means of a mechanical attachment with which the sheath is joined to the attachment components by nonpositive and/or positive engagement, creates a moisture-tight or fuel- and lubricant-tight and pressure-tight bond between the electrical passivation and the attachment components of the end faces of the piezoelectric actuator. Thus the moisture or fuels and lubricants are prevented from getting under the ceramic piezoelectric actuator.

For embodying the mechanical attachment, easily mounted, economical standard components, with which a relatively strong prestressing force on the insulation guard layer can also be achieved, can for instance be used. Examples include a coiled wire, a spiral spring applied to the sheath with mechanical prestressing, an annular helical tension spring constructed in radial packing rings, or so-called two-tab clamps.

Advantageously, the insulation guard layer can have a layer thickness that begins in the single-digit micrometer range and is a galvanic coating that can be applied by means of single- or multi-layer systems. The materials comprising the insulation guard layer may be adapted in terms of media resistance, depending on requirements, and the connection with the piezoelectric actuator can be based on a galvanic single- or multi-layer system, for instance, which creates a bridge or a connection of the electrical passivation of the piezoelectric actuator to the attachment components and thus protects against moisture, the fuels and lubricants, and pressure.

An advantageous application of the piezoelectric actuator module of the invention is obtained if the piezoelectric actuator module is a component of a piezoelectric injector with direct needle control for an injection system for fuel in an internal combustion engine, in which the fuel at high pressure bathes the sheath.

BRIEF DESCRIPTION OF THE DRAWINGS

The invention will be better understood and further objects and advantages thereof will become more apparent from the ensuing detailed description of preferred embodiments taken in conjunction with the drawings, in which.

DESCRIPTION OF PREFERRED EMBODIMENTS

Figure 1:
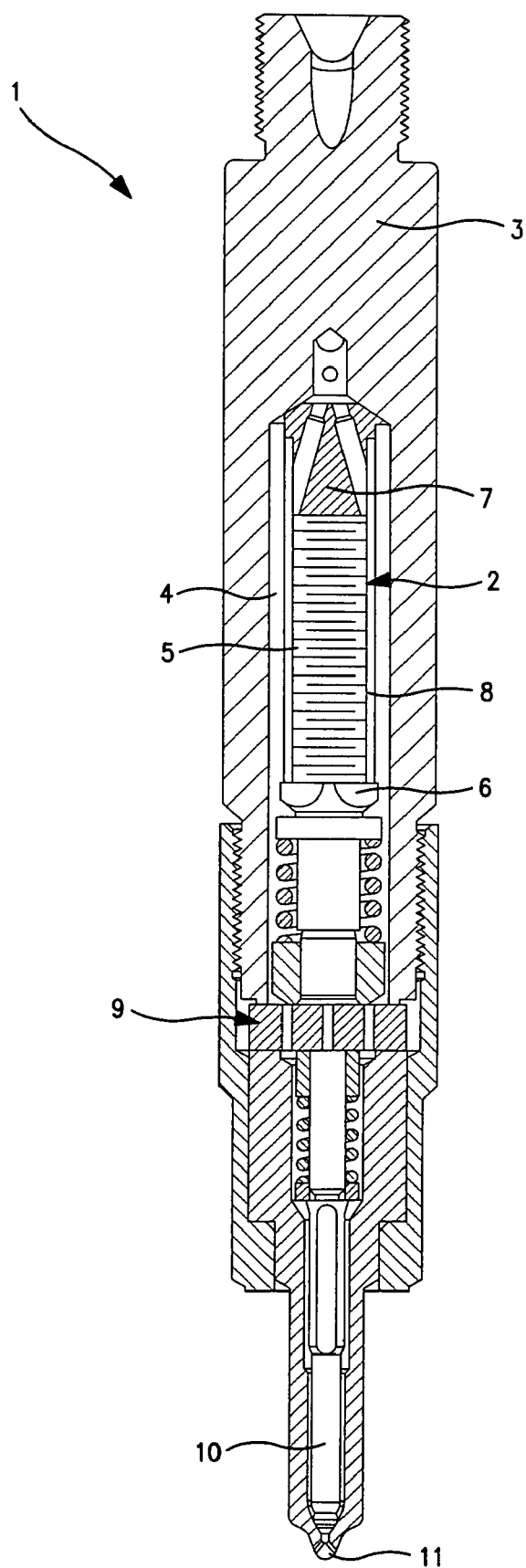
FIG. 1 is a section through a piezoelectric injector having a piezoelectric actuator in accordance with the prior art.

In FIG. 1, a basic construction of a piezoelectric injector 1 with a piezoelectric actuator module 2 in accordance with the prior art is shown; this may be used for instance for needle stroke control in an injection system for fuel in an internal combustion engine. In the upper part, there is a holder body 3, which can be adapted in its geometric dimensions essentially to the particular intended use and the specific site where it will be used. By means of the holder body 3, with a specifically adapted plug embodiment, the electrical voltage for triggering the piezoelectric elements 5 disposed in an inner chamber 4 in the holder body 3 is carried; the piezoelectric elements, together with a head part 6 and a foot part 7, are components of the piezoelectric actuator module 2. Around the piezoelectric elements 5, an insulating sleeve 8 shown only schematically here is placed as a sheath.

Upon actuation, the piezoelectric elements 5 acts as a piezoelectric actuator, via a mechanical arrangement having a coupler 9 and located perpendicularly below the piezoelectric elements here, on a nozzle needle 10 in such a way that an uncovering of a nozzle opening 11 can take place here. Fuel carried in the interior of the piezoelectric actuator 1 through the inner chamber 4 of the holder body 3 can thus be injected into the combustion chamber of an internal combustion engine, not shown here.

At the attachment points between the sleeve 8 and in particular the head part 6 and foot part 7, the migration of fuel toward and underneath the piezoelectric elements 5 cannot be precluded here, unless further measures are taken.

Below, exemplary embodiments of attachments according to the invention of a sleeve to suitably designed versions of a piezoelectric actuator module will now be explained.

Figure 2:
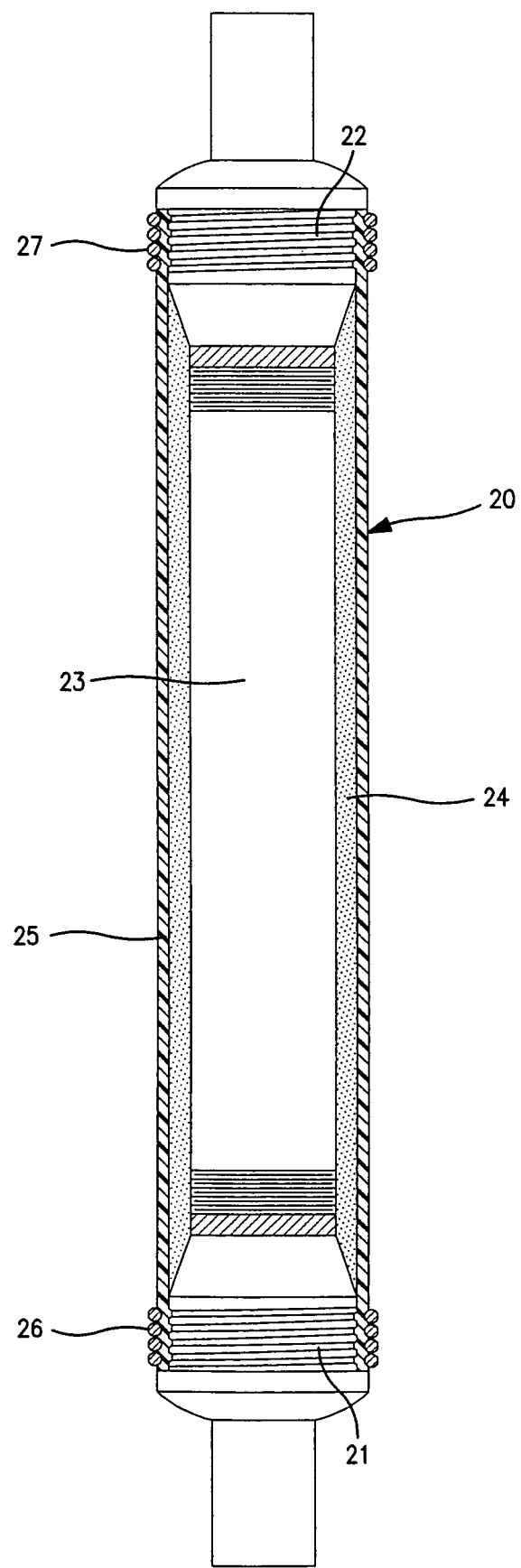
FIG. 2 shows a version according to the invention of a piezoelectric actuator, having a spiral spring and corresponding indentations that hold a shrink-fit tubing, as the plastic sleeve.

In FIG. 2, a first exemplary embodiment is shown, with a piezoelectric actuator module 20 that is constructed from a head part 21, a foot part 22, and piezoelectric elements 23 placed between them, approximately corresponding to the piezoelectric actuator module 2 shown in FIG. 1. Here, there is also an electrically insulating elastomer layer 24, enclosed by a shrink-fit tubing, as a plastic sleeve 25, that is shrunk on.

Spiral springs 26 and 27, as resilient clamping elements, can each be seen at the attachment points of the plastic sleeve 25 to the head part 21 and foot part 22, respectively; these springs engage corresponding helically extending indentations on the head part 21 and on the foot part 22, with the end portions of the sleeve therebetween.

Figure 3A:
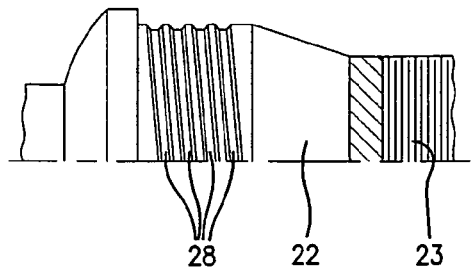
FIGS. 3a through 3d show a first exemplary embodiment in accordance with FIG. 2 in detail, with helical indentations and a spiral spring, in various views.
Figure 3B:
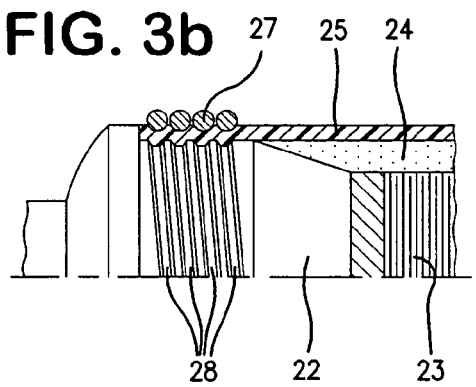

In FIG. 3a, a detail of one such foot part 22 is shown; in this case, however, relative portion of the head part (21 in FIG. 2) are embodied identically. On the circumference of the foot part 22 of FIG. 3a, helical indentations 28 can be seen. FIG. 3b shows the foot part 22 after the attachment of the plastic sleeve 25; the spiral spring 27 of FIG. 2, contacting the outside, can be seen, which presses the plastic sleeve 25, in this case into the indentations 28.

Figure 3C:
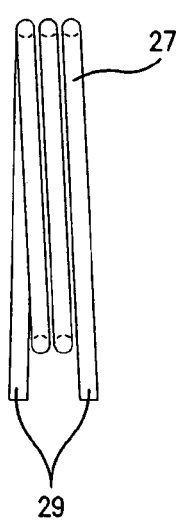
Figure 3D:
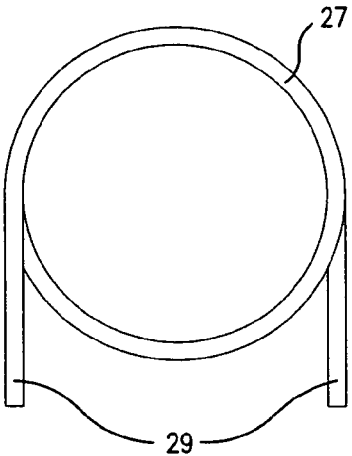

FIG. 3c shows the spiral spring 27 separately in a side view, and FIG. 3d shows the spiral spring 27 separately in a plan view.

As can be seen from FIG. 3c, the spiral spring 27 is provided with two legs 29, which serve the purpose of installation. If upon installation of the spiral spring 27 the two legs 29 are forced apart, then the spiral spring 27 becomes larger in diameter and can be brought to its position above the indentations 28, where these indentations now finish the additionally required sealing force. The spiral spring 27 moreover prevents a flow of the shrink-fit tubing or plastic sleeve 25 to the outside. The two legs 29 of the spiral spring 27 may be cut off after installation.

The shrinking on of the shrink-fit tubing, as a plastic sleeve 25, a process that is especially advantageous according to the invention, initially already brings about strong pressure of the plastic into the thread profile. With increasing temperature, the shrink-fit tubing elongates considerably more than does the steel groove on the head part 21 or on the foot part 22, resulting in even stronger pressure against the thread flanks. At low temperatures, the shrink-fit tubing presses more strongly against the external geometry of the steel head or foot part 21, 22. Thus secure compartmentalization of the plastic sleeve 25 is provided in the sealing region, and flowing of the plastic is averted.

The spiral spring 27 of FIGS. 3a through 3d is thus a radially acting clamping ring, and as a result it generates the required additional pressure of the ends of the plastic sleeve 25 into the threaded profile of the indentations 28.

Figure 4A:
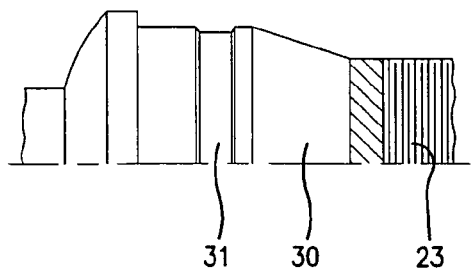
FIGS. 4a through 4d show a second exemplary embodiment, with an annular indentation and spring lugs, in various views.
Figure 4B:
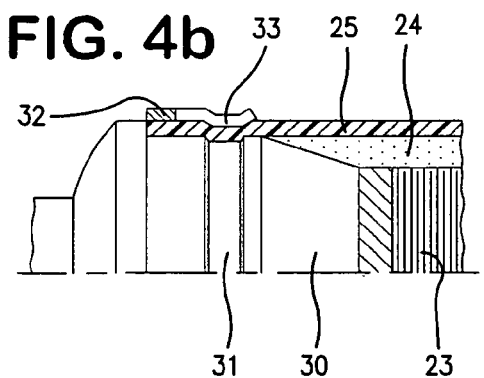

In FIG. 4a, a detail of a foot part 30 in a second exemplary embodiment is shown; here again, relative portions of the head part are embodied identically. An annular indentation 31 can be seen on the circumference of the foot part 30 in FIG. 4a. FIG. 4b shows the foot part 30 after the attachment of the plastic sleeve 25; in this case there is a ring 32, resting on the outside, that has spring lugs 33 which press the plastic sleeve 25 in this case into the indentation 31.

Figure 4C:
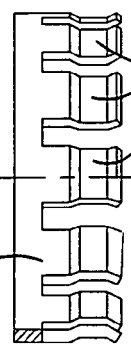
Figure 4D:
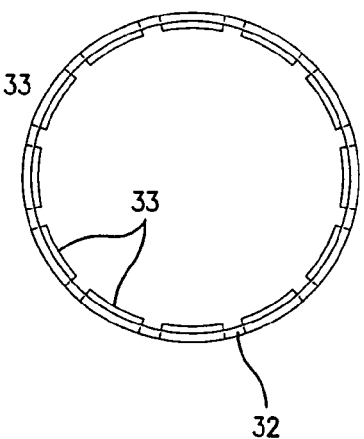

FIG. 4c shows the ring 32 with the spring lugs 33 as an alternative clamping element to the spiral spring 27 of FIGS. 3a through 3d, separately in a side view, and FIG. 4d shows the ring 32 with the spring lugs 33 separately in plan view.

The spring lugs 33 of FIGS. 4a through 4d function here as radially acting clamping tongues, which after the ring 32 has been pressed onto its position relative to the encompassing indentation 31 on the foot part 30 and on the head part bring about the additionally required sealing force by means of an elastic deformation, in a manner corresponding to the spiral spring 27 of FIGS. 3a through 3d.

Figure 5:
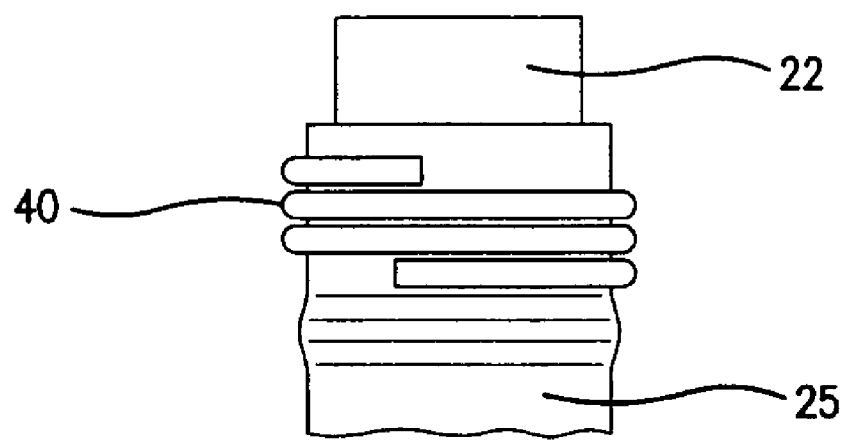
FIG. 5 shows a further version of the mechanical attachment of the sheathing insulation guard layer to the attachment components, with a spiral spring.

It can be seen from FIG. 5 how a mechanical attachment by nonpositive and/or positive engagement of the sheathing insulation guard layer 25 to the attachment component 22 is effected with a simple spiral spring 40, optionally with pre-stressing.

Figure 6:
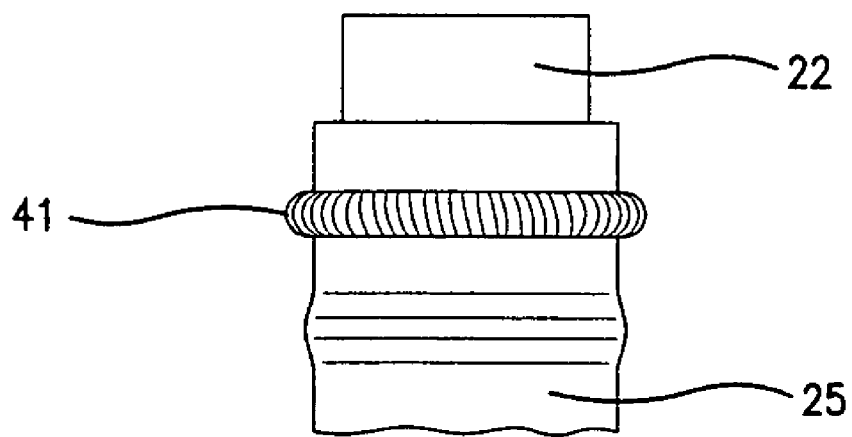
FIG. 6 shows another version of the mechanical attachment of the sheathing insulation guard layer to the attachment components, with a helical tension spring.

In FIG. 6, a further exemplary embodiment is shown, in which the mechanical attachment by nonpositive and/or positive engagement of the sheathing insulation guard layer 25 to the attachment component 22 comprises an annular helical tension spring 41 constructed in radial packing rings.

The foregoing relates to preferred exemplary embodiments of the invention it being understood that other variants and embodiments thereof are possible within the spirit and scope of the invention, the latter being defined by the appended claims.

We claim:

1. In a piezoelectric actuator module having a piezoelectric actuator fastened between an actuator head and an actuator foot, and having a sheath, surrounding the piezoelectric actuator, for electrical passivation, the improvement wherein the sheath is an insulation guard layer joined by nonpositive and/or positive engagement by means of a mechanical attachment to attachment components in the region of the end faces of the piezoelectric actuator or of the actuator head and/or the actuator foot, wherein the sheath is a plastic sleeve as the insulation layer, which sheath rests firmly and in sealing fashion in annularly or helically extending indentations on the circumference of the cylindrical head and/or foot part of the piezoelectric actuator module, wherein the plastic sleeve comprises material that shrinks under the influence of temperature, wherein the indentations are helically extending indentations, the module further comprising a spiral spring mounted on the outside on the circumference of the plastic sleeve that rests on the head and/or foot part, the spiral spring pressing the plastic sleeve into these indentations.

2. The piezoelectric actuator module as defined claim 1, wherein each head and/or foot part of the piezoelectric actuator module is of steel.

3. In a piezoelectric actuator module having a piezoelectric actuator fastened between an actuator head and an actuator foot, and having a sheath, surrounding the piezoelectric actuator, for electrical passivation, the improvement wherein the sheath is an insulation guard layer joined by nonpositive and/or positive engagement by means of a mechanical attachment to attachment components in the region of the end faces of the piezoelectric actuator or of the actuator head and/or the actuator foot, wherein the sheath is a elastic sleeve as the insulation layer, which sheath rests firmly and in sealing fashion in annularly or helically extending indentations on the circumference of the cylindrical head and/or foot part of the piezoelectric actuator module, wherein the plastic sleeve comprises material that shrinks under the influence of temperature, wherein the indentations comprise at least one annularly extending indentation in the head and/or foot part of the piezoelectric actuator module, the module further comprising a ring with spring lugs distributed over its circumference attached to the outside on the circumference of the plastic sleeve resting on the head and/or foot part, the ring corresponding to the at least one annularly extending indentation and pressing the plastic sleeve into the at least one indentation.

4. The piezoelectric actuator module as defined by claim 1, further comprising an electrical insulation layer between the plastic sleeve and the piezoelectric actuator module at least in the region of the piezoelectric elements of the module.

5. In a piezoelectric actuator module having a piezoelectric actuator fastened between an actuator head and an actuator foot, and having a sheath, surrounding the piezoelectric actuator, for electrical passivation, the improvement wherein the sheath is an insulation guard layer joined by nonpositive and/or positive engagement by means of a mechanical attachment to attachment components in the region of the end faces of the piezoelectric actuator or of the actuator head and/or the actuator foot, wherein the sheath is a plastic sleeve as the insulation layer, which sheath rests firmly and in sealing fashion in annularly or helically extending indentations on the circumference of the cylindrical head and/or foot part of the piezoelectric actuator module, wherein the elastic sleeve comprises material that shrinks under the influence of temperature, wherein the mechanical attachment comprises a wound wire, preferably a spiral spring.

6. In a piezoelectric actuator module having a piezoelectric actuator fastened between an actuator head and an actuator foot, and having a sheath, surrounding the piezoelectric actuator, for electrical passivation, the improvement wherein the sheath is an insulation guard layer joined by nonpositive and/or positive engagement by means of a mechanical attachment to attachment components in the region of the end faces of the piezoelectric actuator or of the actuator head and/or the actuator foot, wherein the sheath is a plastic sleeve as the insulation layer, which sheath rests firmly and in sealing fashion in annularly or helically extending indentations on the circumference of the cylindrical head and/or foot part of the piezoelectric actuator module, wherein the plastic sleeve comprises material that shrinks under the influence of temperature, wherein the mechanical attachment comprises an annular helical tension spring constructed in radial packing rings.

7. In a piezoelectric actuator module having a piezoelectric actuator fastened between an actuator head and an actuator foot, and having a sheath, surrounding the piezoelectric actuator, for electrical passivation, the improvement wherein the sheath is an insulation guard layer joined by nonpositive and/or positive engagement by means of a mechanical attachment to attachment components in the region of the end faces of the piezoelectric actuator or of the actuator head and/or the actuator foot, wherein the sheath is a plastic sleeve as the insulation layer, which sheath rests firmly and in sealing fashion in annularly or helically extending indentations on the circumference of the cylindrical head and/or foot part of the piezoelectric actuator module, wherein the plastic sleeve comprises material that shrinks under the influence of temperature, wherein the mechanical attachment comprises two-tab clamps.

8. The piezoelectric actuator module as defined by claim 3, wherein each head And/or foot part of the piezoelectric actuator module is of steel.

9. The piezoelectric actuator module as defined by claim 5, wherein each head and/or foot part of the piezoelectric actuator module is of steel.

10. The piezoelectric actuator module as defined by claim 6, wherein each head and/or foot part of the piezoelectric actuator module is of steel.

11. The piezoelectric actuator module as defined by claim 7, wherein each head and/or foot part of the piezoelectric actuator module is of steel.

12. The piezoelectric actuator module as defined by claim 3, further comprising an electrical insulation layer between the plastic sleeve and the piezoelectric actuator module at least in the region of the piezoelectric elements of the module.

13. The piezoelectric actuator module as defined by claim 5, further comprising an electrical insulation layer between the plastic sleeve and the piezoelectric actuator module at least in the region of the piezoelectric elements of the module.

14. The piezoelectric actuator module as defined by claim 6, further comprising an electrical insulation layer between the plastic sleeve and the piezoelectric actuator module at least in the region of the piezoelectric elements of the module.

15. The piezoelectric actuator module as defined by claim 7, further comprising an electrical insulation layer between the plastic sleeve and the piezoelectric actuator module at least in the region of the piezoelectric elements of the module.

* * * * *